(12) United States Patent
Tocchio et al.

(10) Patent No.: US 10,202,275 B2
(45) Date of Patent: Feb. 12, 2019

(54) PROCESS FOR MANUFACTURING A SEMICONDUCTOR DEVICE INCLUDING A MICROELECTROMECHANICAL STRUCTURE AND AN ASSOCIATED INTEGRATED ELECTRONIC CIRCUIT AND CORRESPONDING SEMICONDUCTOR DEVICE

(71) Applicant: STMICROELECTRONICS S.R.L., Agrate Brianza (IT)

(72) Inventors: Alessandro Tocchio, Milan (IT); Lorenzo Corso, Ruginello (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/452,424

(22) Filed: Mar. 7, 2017

(65) Prior Publication Data
US 2018/0044168 A1 Feb. 15, 2018

(30) Foreign Application Priority Data

Aug. 9, 2016 (IT) .......................... 102016000083804

(51) Int. Cl.
*B81B 7/00* (2006.01)
*B81C 1/00* (2006.01)

(52) U.S. Cl.
CPC .......... *B81B 7/007* (2013.01); *B81C 1/00246* (2013.01); *B81B 2201/0235* (2013.01); *B81B 2201/0264* (2013.01); *B81B 2207/092* (2013.01); *B81B 2207/096* (2013.01); *B81C 2201/0132* (2013.01); *B81C 2203/0118* (2013.01); *B81C 2203/0136* (2013.01); *B81C 2203/0771* (2013.01); *B81C 2203/0792* (2013.01)

(58) Field of Classification Search
None
See application file for complete search history.

(56) References Cited

U.S. PATENT DOCUMENTS

| | | | |
|---|---|---|---|
| 6,838,362 B2 | 1/2005 | Mastromatteo et al. | |
| 2006/0208326 A1 | 9/2006 | Nasiri et al. | |
| 2011/0095835 A1 | 4/2011 | McCraith et al. | |
| 2013/0140650 A1* | 6/2013 | Lee | H04R 19/005 257/415 |
| 2014/0252508 A1 | 9/2014 | Cheng et al. | |
| 2014/0332909 A1* | 11/2014 | Li | B81C 1/00238 257/415 |
| 2015/0360936 A1 | 12/2015 | Tayebi et al. | |
| 2016/0318753 A1* | 11/2016 | Chou | B81B 3/001 |
| 2016/0355394 A1* | 12/2016 | Tseng | B81B 7/0041 |

* cited by examiner

Primary Examiner — Jay C Chang
(74) Attorney, Agent, or Firm — Seed IP Law Group LLP

(57) ABSTRACT

A process for manufacturing an integrated semiconductor device, envisages: forming a MEMS structure; forming an ASIC electronic circuit; and electrically coupling the MEMS structure to the ASIC electronic circuit. The MEMS structure and the ASIC electronic circuit are integrated starting from a same substrate including semiconductor material; wherein the MEMS structure is formed at a first surface of the substrate, and the ASIC electronic circuit is formed at a second surface of the substrate, vertically opposite to the first surface in a direction transverse to a horizontal plane of extension of the first surface and of the second surface.

18 Claims, 17 Drawing Sheets

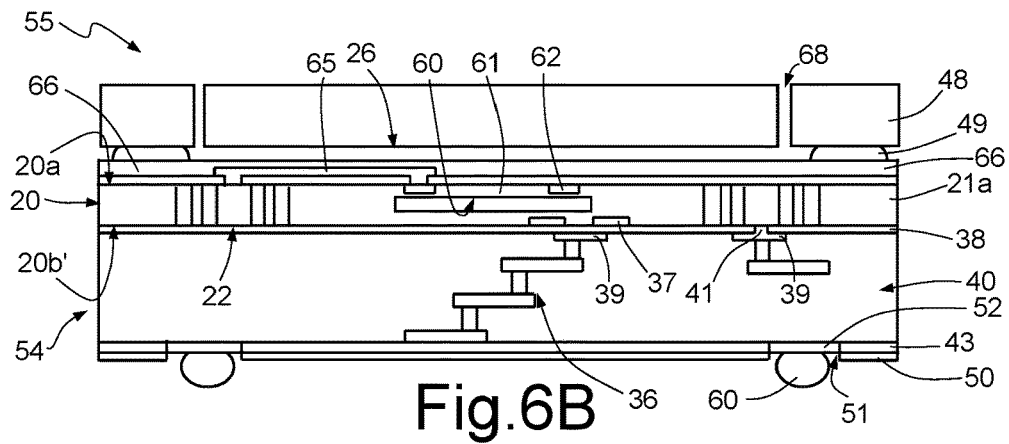

PROCESS FOR MANUFACTURING A SEMICONDUCTOR DEVICE INCLUDING A MICROELECTROMECHANICAL STRUCTURE AND AN ASSOCIATED INTEGRATED ELECTRONIC CIRCUIT AND CORRESPONDING SEMICONDUCTOR DEVICE

BACKGROUND

Technical Field

The present disclosure relates to a process for manufacturing a semiconductor device including a MEMS (Micro-Electro-Mechanical System) structure and an associated integrated electronic circuit, and to a corresponding semiconductor device.

Description of the Related Art

Semiconductor devices, for example sensor devices, are known, including: at least one MEMS structure, for example a sensing structure designed to generate an electrical quantity in response to a detected quantity (such as an acceleration, an angular velocity, or a pressure); and a coupled integrated electronic circuit (ASIC, Application-Specific Integrated Circuit), which integrates appropriate circuit elements for processing (for example, by amplification and filtering) the aforesaid electrical quantity generated by the MEMS structure and supplying an output signal, for example a voltage indicative of the detected quantity.

The MEMS structure and the corresponding ASIC electronic circuit are typically provided in respective dies of semiconductor material, which are housed, electrically connected together in a suitable manner, within a same package. The package defines the mechanical and electrical interface of the integrated semiconductor device towards the external environment, for example, for coupling to a PCB (Printed-Circuit Board) of an electronic apparatus that incorporates the integrated semiconductor device.

As it is known, generally, manufacturing of the MEMS structure of the integrated semiconductor device entails manufacturing steps that are not compatible with the manufacturing of the coupled ASIC electronic circuit, which typically envisages CMOS (Complementary Metal Oxide Semiconductor) process steps; for example, the temperatures, materials, and processing environments envisaged for the MEMS structure may not be compatible with at least some of the CMOS process steps.

For instance, the temperature of epitaxial deposition of a polysilicon layer starting from which a mobile mass of the MEMS structure is defined, for example approximately 1100° C., may not be compatible with the melting point of metallization layers of the ASIC, for example approximately 450° C. in the case of aluminum.

It is, thus, common practice to manufacture separately, with respective independent manufacturing operations, the MEMS structure and the corresponding ASIC in respective substrates (or wafers) of semiconductor material, and subsequently bond together the two substrates (or wafers) with bonding techniques.

FIG. 1 shows an example of integrated semiconductor device 1, of a known type, in which a first substrate 2, including a MEMS structure (purely by way of non-limiting example here comprising a cavity 3 and a membrane 4 extending above the cavity 3), is stacked on top of a second substrate 5, including an ASIC electronic circuit, within a package 6.

The MEMS structure integrated in the first substrate 2 and the ASIC electronic circuit integrated in the second substrate 5 are manufactured in a separate and independent way, before the same first and second substrates 2, 5 are stacked on top of one another and bonded by an interposed adhesive layer 7.

The stacked structure constituted by the first and second substrates 2, 5 is arranged on a supporting layer 8 via an adhesive layer, the supporting layer 8 constituting the base of the package 6 and having a top surface 8a, to which the second die 5 is attached by a further adhesive layer 9, and a bottom surface 8b, which is in contact with the environment external to the package 6 and carries appropriate electrical-contact elements (not illustrated herein), for example in the form of conductive lands or bumps, designed, for example, for coupling with a PCB.

The first and second substrates 2, 5 have a respective top surface, provided on which are respective contact pads 10, electrically connected to the MEMS structure and to the ASIC electronic circuit (in a way that will be evident to a person skilled in the field). Further contact pads 11 are provided on the top surface 8a of the supporting layer 8.

First bonding wires 12 electrically connect together, according to the so-called "wire-bonding technique," the contact pads 10 of the first and second substrates 2, 5. Second bonding wires 13 connect electrical contact pads 10 of the second substrate 5 to the further contact pads 11.

Electrical connection between the aforesaid further contact pads 11 and the electrical-contact elements carried by the bottom surface 8b of the supporting layer 8 is obtained by through electrical vias (not illustrated herein) that traverse the entire thickness of the same supporting layer 8.

A covering element 14 is further arranged above the top surface of the first substrate 2, and an insulating coating 15, the so-called molding, or mold compound, for example, epoxy resin, coats said covering element 14, the stacked structure of the first and second substrates 2, 5, and the external portions of the top surface 8a of the supporting layer 8 not coated by the second substrate 5. A top surface of the insulating coating 15 constitutes an outer surface of the entire package 6, in contact with the external environment.

The resulting integrated semiconductor device 1, although having in general good electrical performance, thanks in particular to the proven reliability of the coupling via wire bonding between the substrates 2, 5, has, however, quite considerable overall dimensions both in a horizontal direction (transverse to the stacking direction) and in a vertical direction (in the stacking direction).

In particular, there are applications, for example for portable or wearable apparatuses, in which it is certainly desirable for the resulting dimensions of the integrated semiconductor device 1 to be smaller.

Even though further bonding solutions between the substrates integrating the ASIC electronic circuit and the MEMS structure have been proposed, none of these solutions has proven altogether satisfactory.

For instance, FIG. 2 shows a further embodiment of an integrated semiconductor device, once again designated by 1, of a known type.

In this solution, the first substrate 2, which integrates the MEMS structure (once again represented schematically), is bonded to the second substrate 5, which integrates the ASIC electronic circuit, by aluminum-germanium (Al—Ge) wafer-to-wafer bonding.

In particular, a bonding ring 17, of conductive material, arranged between the top surfaces of the first and second substrates 2, 5, facing one another, in addition to defining the mechanical coupling between the substrates 2, 5, defines the mutual electrical connections.

The above embodiment is more compact, both in a horizontal direction and in a vertical direction, thus enabling a corresponding reduction of the dimensions of the integrated semiconductor device 1. However, as will be evident to a person skilled in the field, it is difficult to guarantee hermetic coupling between the substrates 2, 5 and at the same time electrical connection by the aforesaid bonding ring 17.

A further solution that has been proposed (see, for example, U.S. 2011/095835), envisages that the manufacturing steps of the MEMS structure are carried out following upon the CMOS processing steps that have previously led to manufacturing of the ASIC electronic circuit.

In particular, on a top metallization level, which defines the top surface of the CMOS substrate in which the ASIC electronic circuit is provided, at a low temperature (in order not to damage the elements of the same ASIC electronic circuit), a silicon-germanium (Si—Ge) layer is grown and subsequently subjected to further manufacturing operations for definition of the MEMS structure.

Albeit enabling a further reduction of the dimensions of the integrated semiconductor device, the above solution is particularly critical, in so far as the process steps for manufacturing of the MEMS structure may damage the underlying ASIC electronic circuit; in any case, this solution is complex, in so far as the above process steps must be provided by specific arrangements for preserving the integrity of the ASIC electronic circuit.

BRIEF SUMMARY

At least one embodiment of the present disclosure solves the problems highlighted previously, and in particular to provide an improved solution for the manufacturing of a semiconductor device including both a MEMS structure and an ASIC electronic circuit made with the CMOS technique.

Consequently, according to the present disclosure, a process for manufacturing a semiconductor device and a corresponding semiconductor device are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 6a and 6b are schematic cross-sectional views of a package of the integrated semiconductor device;

FIGS. 7a-7j are schematic cross-sectional views of an integrated semiconductor device in successive steps of a manufacturing process according to a third embodiment of the present solution.

DETAILED DESCRIPTION

As will be discussed in detail, one aspect of the present solution generally envisages integrating a MEMS structure and an ASIC electronic circuit in a same processed substrate (or wafer), including semiconductor material and compatible with CMOS or high-speed CMOS (HCMOS) techniques, while maintaining substantially separate and distinct the manufacturing processes of the MEMS structure and the ASIC electronic circuit, so that no particular arrangements or modifications are required to the same processes to prevent mutual negative effects during the corresponding steps.

In particular, the MEMS structure and the ASIC electronic circuit are provided at vertically opposite surfaces of the substrate (or wafer) being processed, and interconnection structures are formed through the substrate for electrical connection between the MEMS structure and the ASIC electronic circuit. During manufacture, thanks to the interposition of the substrate, the process steps carried out to obtain the MEMS structure thus do not affect the ASIC electronic circuit, and, likewise, the process steps carried out to obtain the ASIC electronic circuit do not affect the MEMS structure.

The processes used for providing the MEMS structure and the ASIC electronic circuit may thus be, taken by themselves, of a substantially standard type, without particular modifications being required for integration in the same substrate.

Figure 1:
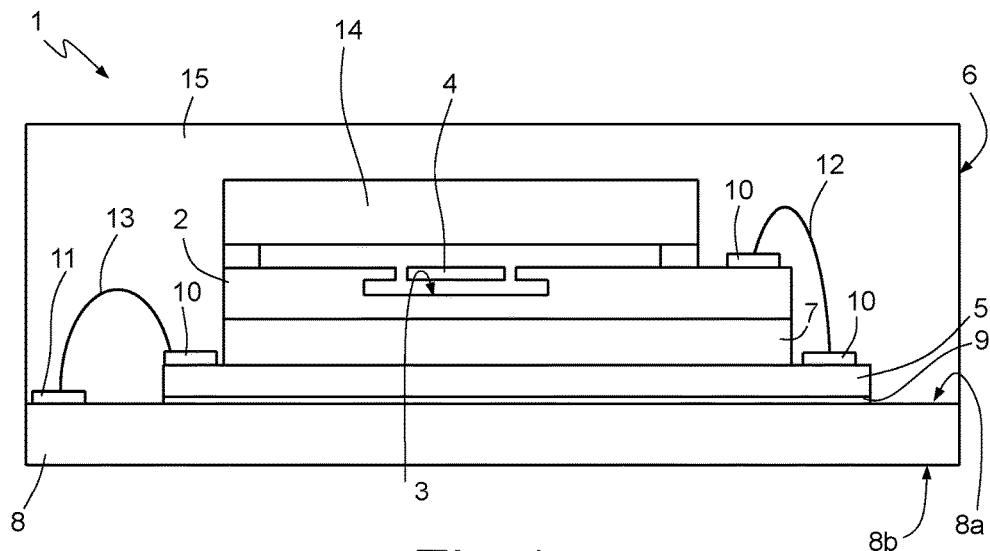
FIG. 1 is a schematic cross-sectional view of an integrated semiconductor device of a known type.
Figure 2:
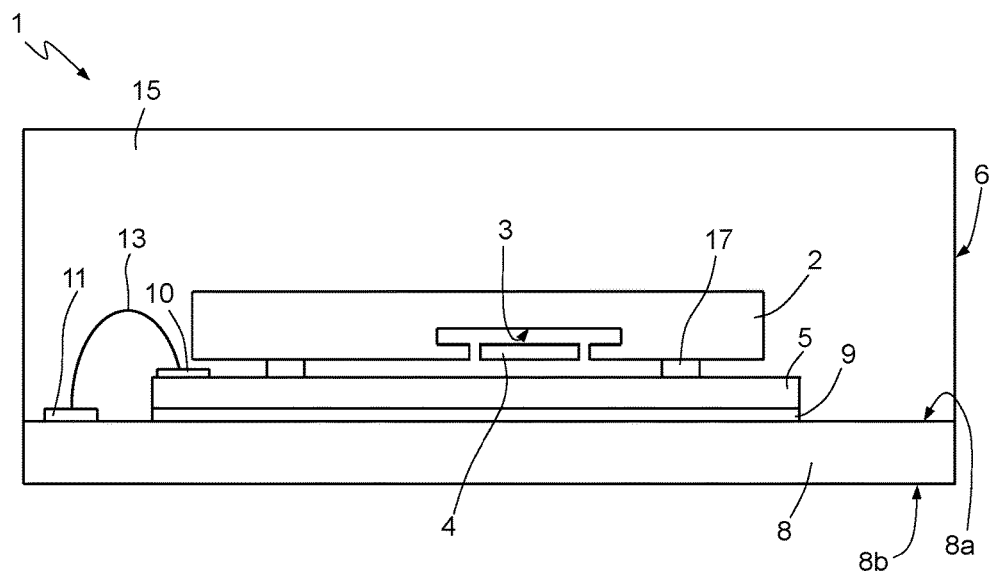
FIG. 2 is a schematic cross-sectional view of a further integrated semiconductor device of a known type.
Figure 3A:
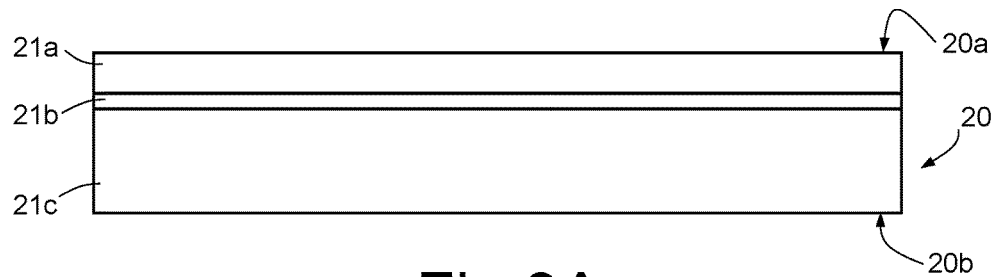
FIGS. 3A-3m are schematic cross-sectional views of an integrated semiconductor device in successive steps of a manufacturing process according to a first embodiment of the present solution.

With reference first to FIG. 3A a first embodiment of a process for manufacturing an integrated semiconductor device according to the present solution is now described.

An initial step of the manufacturing process envisages providing a substrate 20, having a first surface 20a and a second surface 20b opposite to one another in a vertical direction (transverse to a main horizontal plane of extension of the first and second surfaces 20a, 20b).

The substrate 20, in this embodiment of an SOI (Silicon-On-Insulator) type, in this case includes: an active layer 21a, of silicon, for example having a thickness of 50-80 μm; an insulating layer 21b, for example of silicon dioxide; and a structural layer 21c, which is also made of silicon, for example with a thickness of 500-600 μm.

Figure 3B:
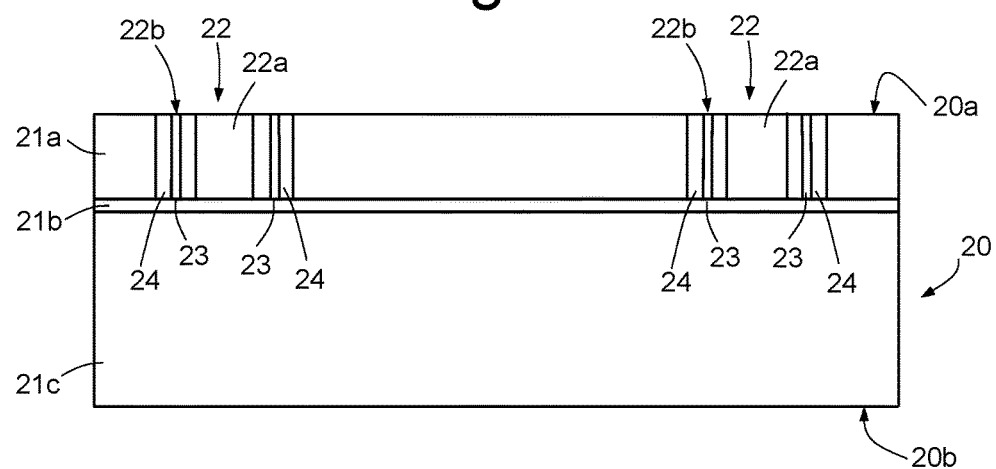

Through a surface portion of the substrate 20, starting from the first surface 20a, in this case throughout the whole thickness of the active layer 21a, interconnection structures 22 are then provided, the so-called vias, as shown in FIG. 3B.

These interconnection structures 22 may, for example, be made, as described in U.S. Pat. No. 6,838,362, which is incorporated herein by reference in its entirety.

Each interconnection structure 22 is in this case constituted by a connection portion 22a, here made of silicon, surrounded by an insulation portion 22b, which electrically insulates the connection portion 22a from the remaining substrate 20.

In particular, the insulation portion 22b, having for example a ring conformation, is in turn formed by a conductive core 23, for example of polysilicon, enclosed in an insulating coating 24, for example of silicon oxide, defining an insulation capacitor for electrically insulating the connection portion 22a from the substrate 20.

The manufacturing process then proceeds with manufacturing steps (in themselves known) for the formation of a MEMS structure (designated by 26 in the subsequent FIG. 3K) on the first surface 20a of the substrate 20. The MEMS structure 26 may, for example, define an accelerometer or a gyroscope or a different sensor.

Figure 3C:
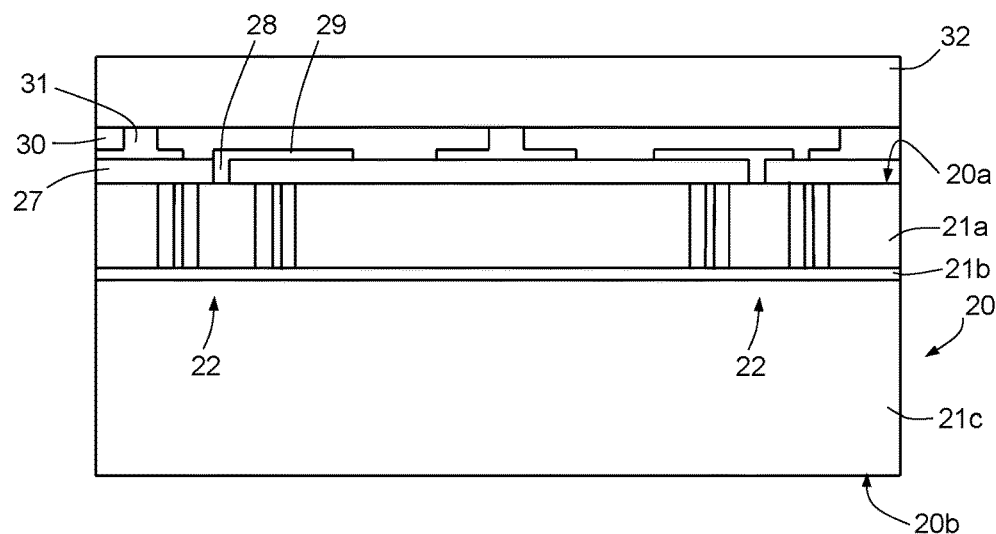

In particular, as illustrated in FIG. 3C, manufacture of the MEMS structure 26 envisages in this case formation of a permanent insulation layer 27, on the first surface 20a of the substrate 20 (thus on the active layer 21a of the same substrate 20), and of conductive portions 28, made, for example, of polysilicon, through the permanent insulation layer 27, in contact with the connection portions 22a of the interconnection structures 22.

Conductive elements 29 are further formed on the permanent insulation layer 27, which are also for example of polysilicon (designed to form electrodes and conductive paths of the MEMS structure 26). In particular, some of these conductive elements 29 contact respective conductive portions 28.

A sacrificial insulation layer 30 is then formed over the conductive elements 29 and the permanent insulation layer 27. The sacrificial insulation layer 30 is, for example, made of silicon oxide and may have a thickness of 1.6-1.8 μm.

Through the thickness of the sacrificial insulation layer 30 anchorage elements 31 are then provided, for example, made of polysilicon, which extend vertically to contact respective conductive elements 29.

An epitaxial layer 32 is then grown on the sacrificial insulation layer 30, for example having a thickness comprised between 20 and 60 μm.

Figure 3D:
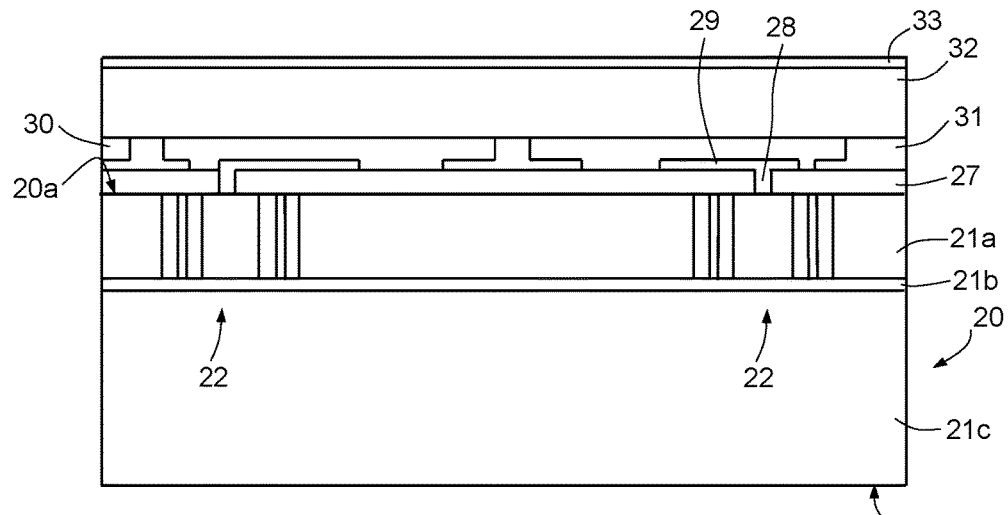

According to an aspect of the present solution, an oxide layer 33 is then formed on the epitaxial layer 32, as illustrated in FIG. 3D; this oxide layer 33, as described hereinafter, is designed for providing a fusion bonding. The oxide layer 33 is further subjected to a planarization surface treatment.

Figure 3E:
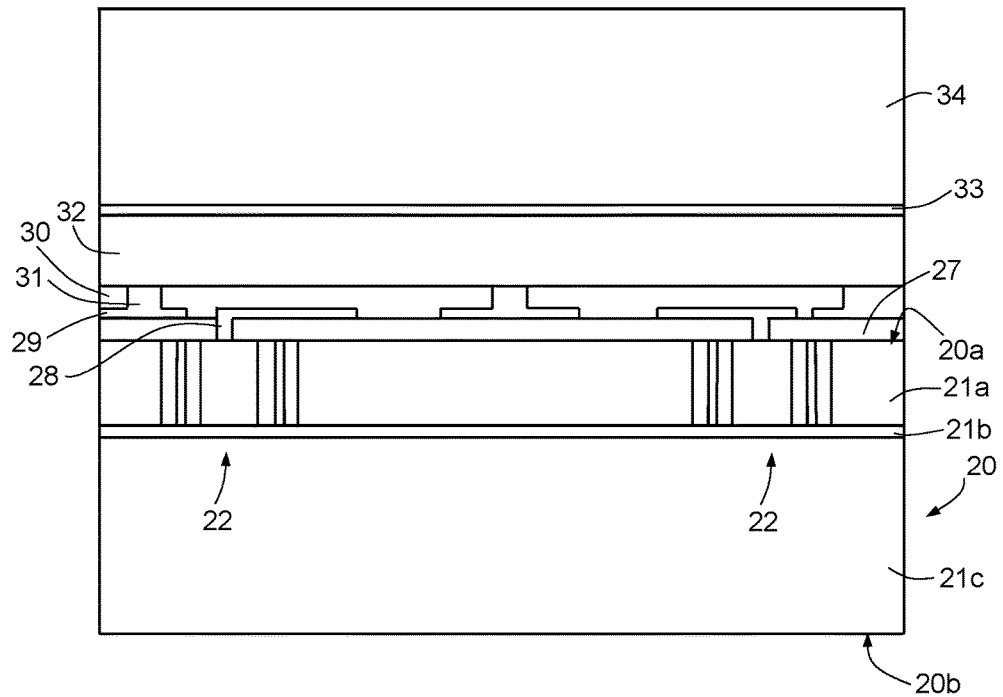

Next, as shown in FIG. 3E, a first service wafer 34, for example, of silicon and having a thickness of 600 μm, is bonded on the oxide layer 33. The first service wafer 34 is designed exclusively for functions of handling of the substrate 20 during its processing.

Figure 3F:
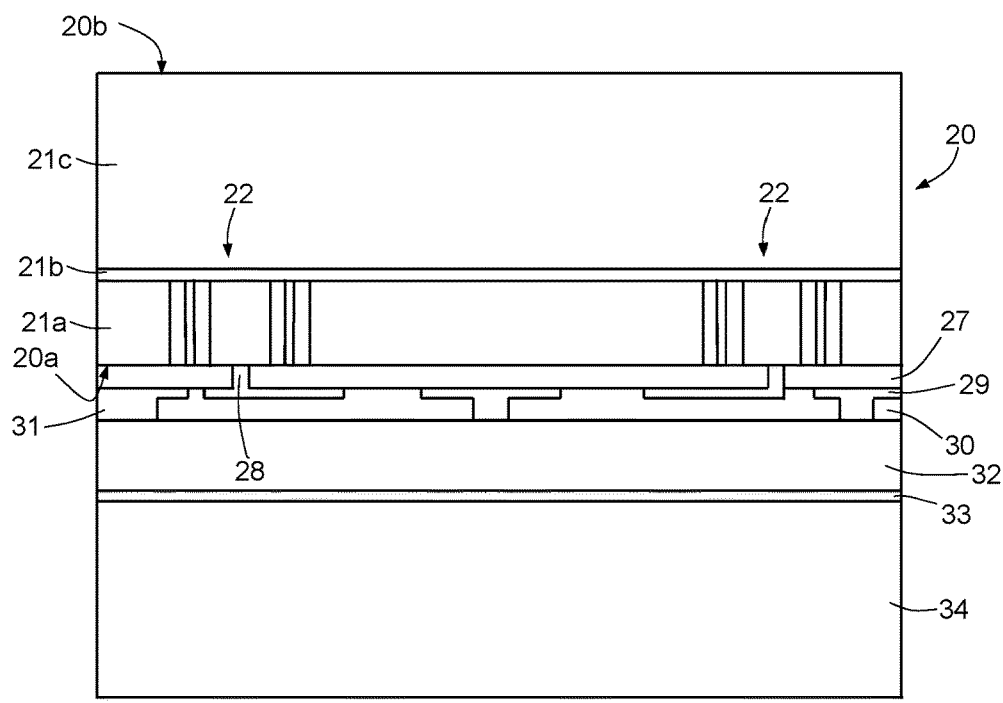

The coupled assembly of the first service wafer 34 and substrate 20 is then subjected to the so-called flip-wafer operation (FIG. 3F) so that the second surface 20b of the substrate 20, and thus the structural layer 21c, is accessible for the subsequent processing steps.

Figure 3G:
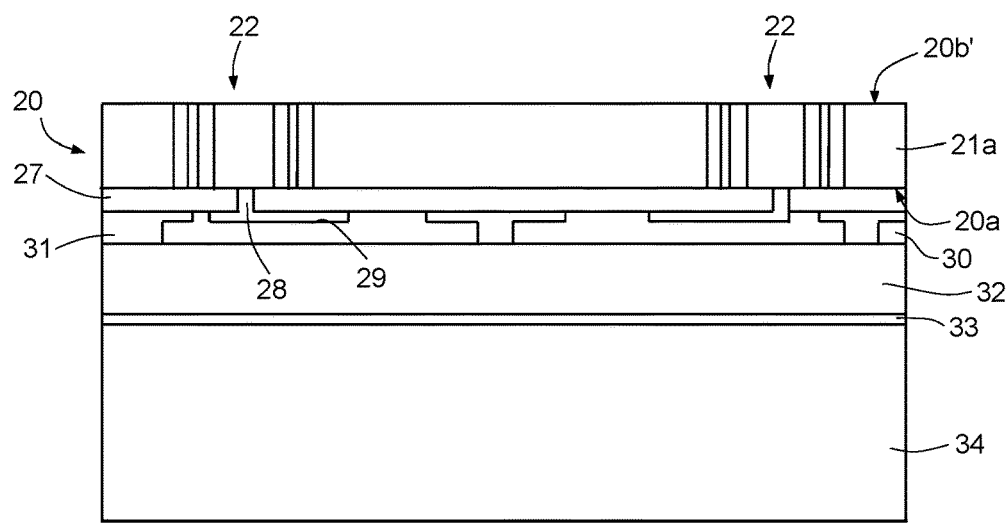

As shown in FIG. 3G, the structural layer 21c is then removed (for example, by lapping, stopping at the insulating layer 21b), and the insulating layer 21b is subsequently removed, for example by chemical etching for rendering accessible a working surface 20b' of the active layer 21a, vertically opposite to the first surface 20a.

The process then proceeds with CMOS process steps, of a per se known type, for obtaining, within the active layer 21a of the substrate 20, on the aforesaid working surface 20b', an ASIC electronic circuit (designated by 36 in the subsequent FIG. 3H), designed to be operatively coupled to the MEMS structure 26 of the integrated semiconductor device.

It should be noted that these process steps are independent of the previous steps for obtaining the MEMS structure 26, and may be carried out without repercussions on the elements previously formed of the same MEMS structure 26, which is arranged in fact vertically opposite and separated by the thickness of the active layer 21a of the substrate 20.

Figure 3H:
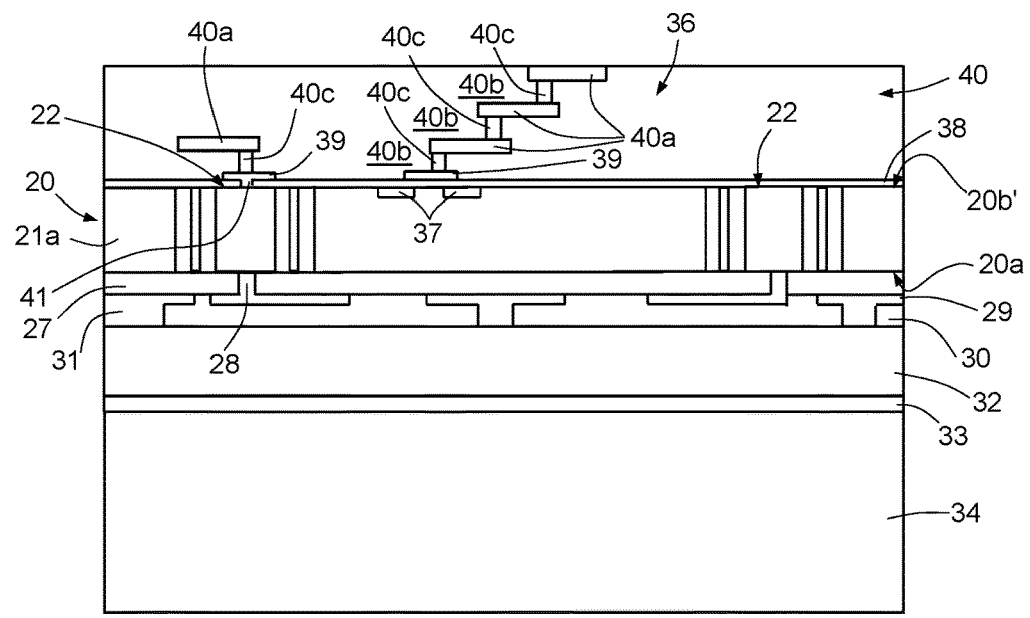

In particular, as shown schematically in FIG. 3H, in a per se known manner, the steps of the CMOS process envisage, among others, formation of: functional regions 37 within the active layer 21a starting from the working surface 20b' (by way of example, doped source and drain regions of a MOSFET are illustrated, obtained by diffusion of dopant, for example of an N type in the case where the active layer 21a has a doping of a P type); an insulation layer 38, which defines, in particular, the gate oxide of the aforesaid MOSFET, over the working surface 20b; electrode elements 39, over the insulation layer 38, including, for example, a gate electrode of the same MOSFET; and, subsequently, a CMOS multilayer 40 on the working surface 20b', constituted by a stack of metallization layers 40a and interposed dielectric layers 40b, with interconnection elements 40c that electrical connect, in an appropriate way, metallization layers 40a arranged on top of one another. The last metallization layer 40a further defines a top surface of the CMOS multilayer 40.

As illustrated in the same FIG. 3H, during the same processing steps the electrical contacts between the ASIC electronic circuit 36 and the MEMS structure 26, via the interconnection structures 22, are further defined.

In particular, the conductive portions 22a of the interconnection structures 22 are connected to respective electrode elements 39 by conductive elements 41 formed through the insulation layer 38. These conductive elements 41, by a respective interconnection element 40c, are further connected to respective portions of the first metallization layer 40a of the CMOS multilayer 40 (in this way, being appropriately connected to one or more components of the ASIC electronic circuit 36, for example to the aforesaid gate electrode of the MOSFET).

Figure 3I:
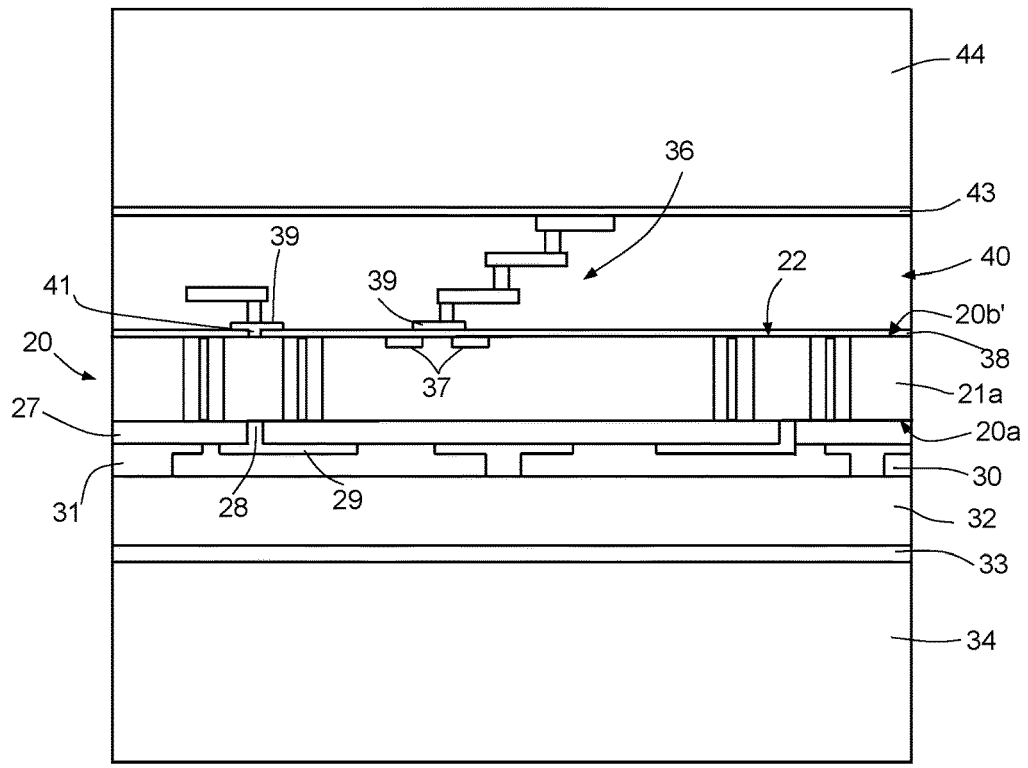
Figure 3J:
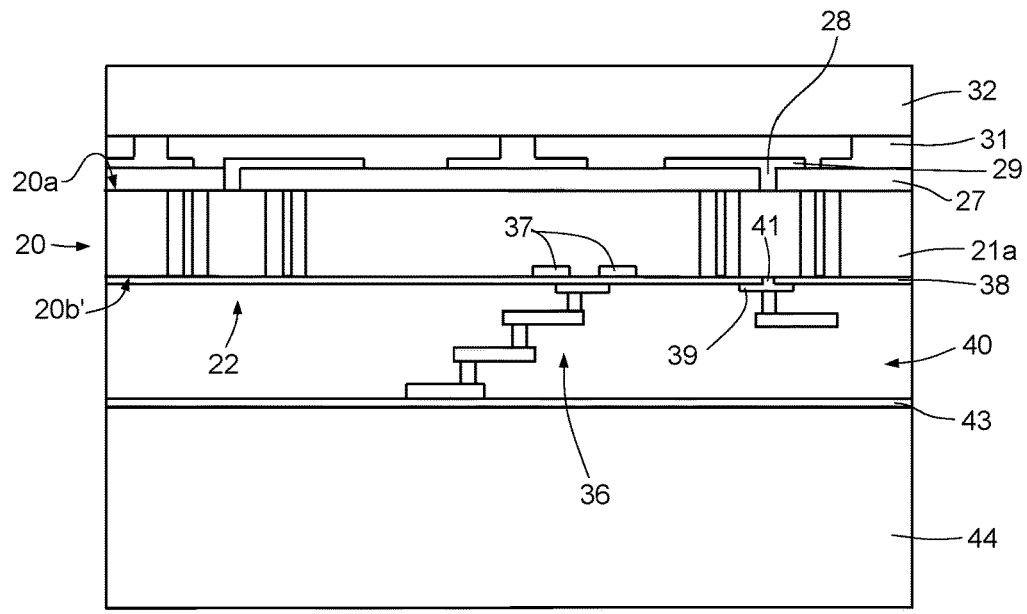

The manufacturing process then proceeds (FIG. 3I), with formation on the multilayer 40 of an oxide layer 43 and then with fusion bonding of a second service wafer 44, for example of silicon and having a thickness of 600 μm, on the aforesaid oxide layer 43. Also this second service wafer 44 is designed exclusively for functions of handling of the substrate 20 being processed.

It should be noted that also this bonding, like the previous one, thus does not create problems of reliability as regards operation of the device, being in fact designed only for handling operations.

Then, a further flip-wafer operation is carried out, following upon which the first service wafer 34 is accessible for processing (the second service wafer 44 instead constituting the handling base).

Figure 3K:
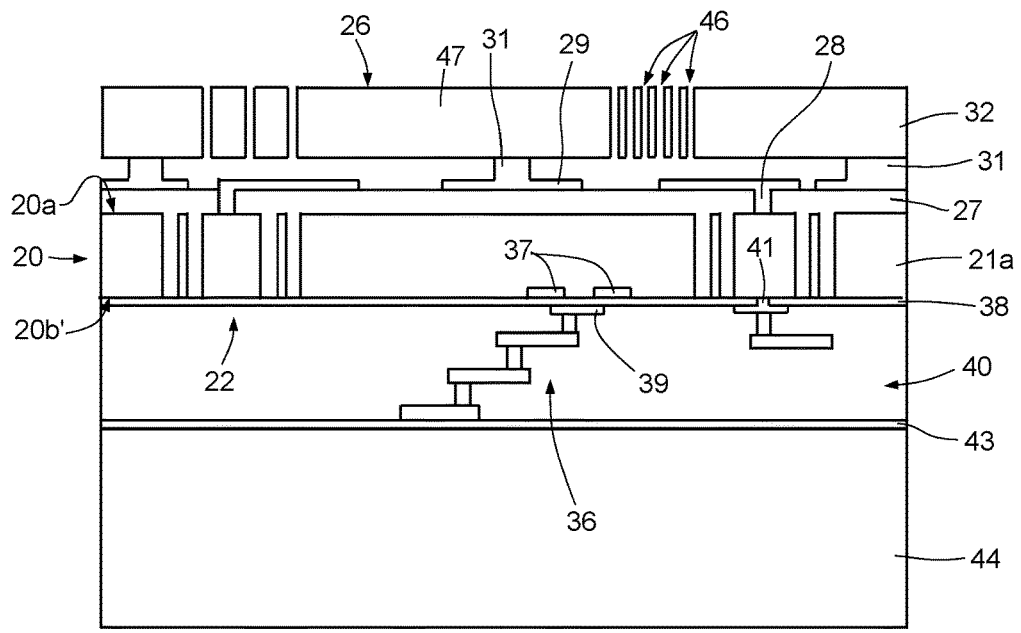

The above first service wafer 34, as illustrated in FIG. 3K, is then removed (for example, by lapping, stopping at the oxide layer 33), and the oxide layer 33 is subsequently removed, for example by chemical etching, for making the epitaxial layer 32 accessible for subsequent processing.

At this point, the manufacturing of the MEMS structure 26 is completed with final processing steps, which are also in themselves known.

In particular (FIG. 3K), through openings 46 are first formed through the entire thickness of the epitaxial layer 32, through which a chemical etch is carried out for removal of the sacrificial insulating layer 30.

This removal, as shown in the same FIG. 3K, entails in particular release of suspended elements 47, which are arranged above the active layer 21a of the substrate 20, constrained to the same active layer 21a by the anchorage elements 31. In a per se known manner, these suspended elements 47 may, for example, constitute inertial masses of the MEMS structure 26.

Figure 3L:
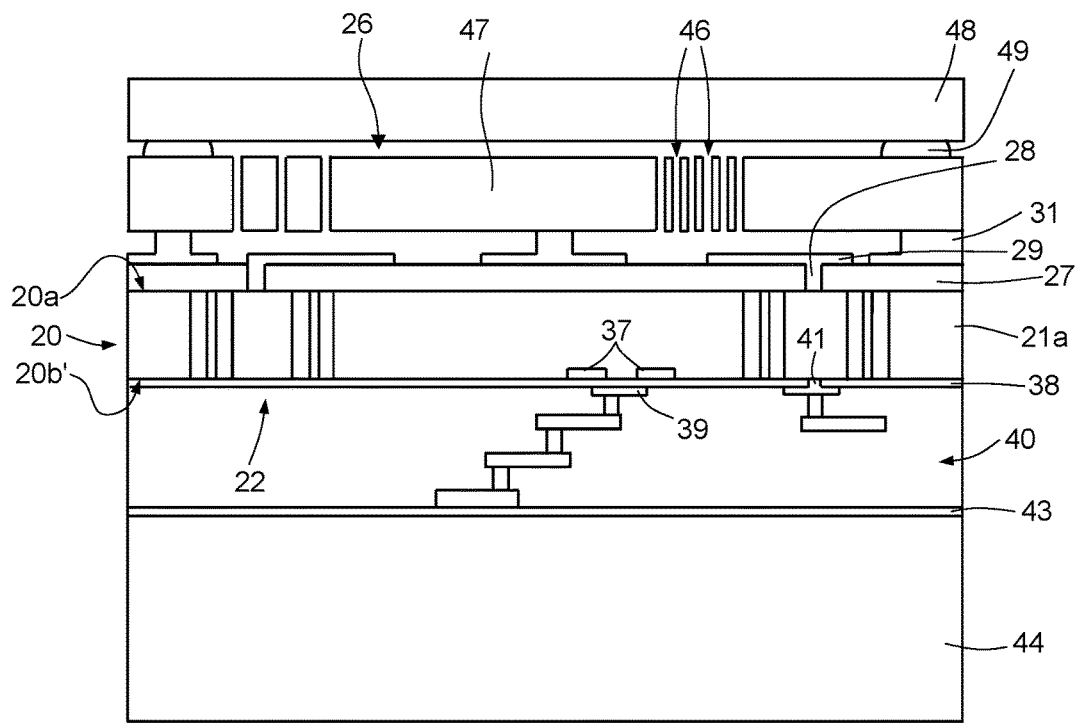

Then, a covering 48 is coupled on the epitaxial layer 32, which covers the MEMS structure 26 and the through openings 46 (FIG. 3L). The covering 48 is bonded to the epitaxial layer 32, for example with the glass-frit bonding technique, by bonding regions 49, which define an empty space above the same epitaxial layer 32.

The manufacturing process envisages at this point final steps for providing a package for the MEMS structure 26 and the corresponding ASIC electronic circuit 36.

In particular, a further flip-wafer operation is carried out, following upon which the second service wafer 44 is available for processing, and subsequently the service wafer 44 is removed, for example via lapping.

Figure 3M:
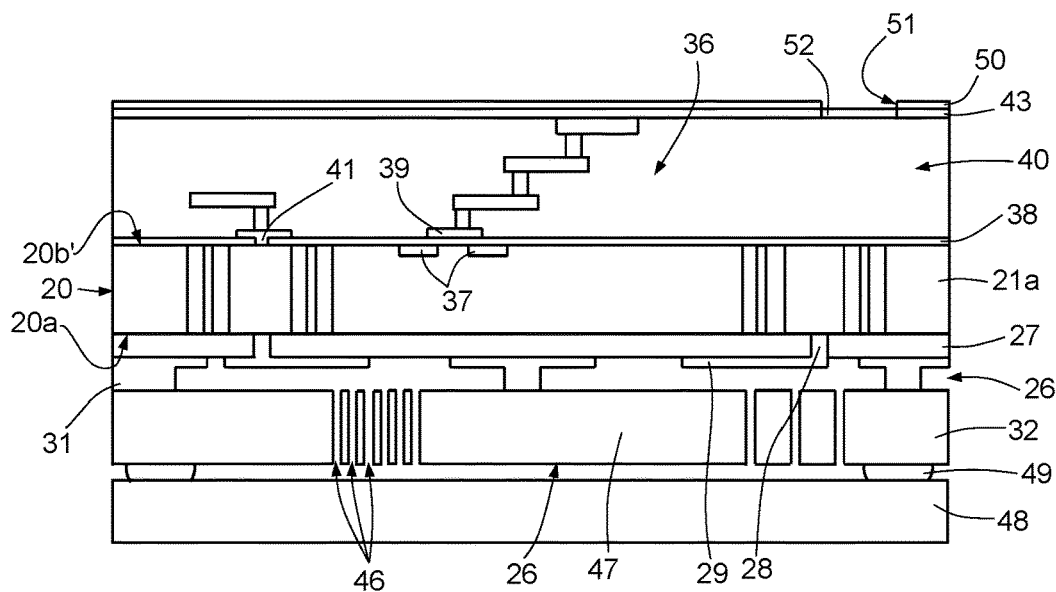

As illustrated in FIG. 3M, a passivation layer 50 is formed on the oxide layer 43, having functions of protection for the underlying ASIC electronic circuit 36, and contact openings 51 are then formed through the same oxide layer 44 and passivation layer 50.

Then contact pads 52 are formed within these contact openings, in electrical contact with respective portions of the last metallization layer 40a, designed to enable electrical contacting of the ASIC electronic circuit 36 from outside the package of the integrated semiconductor device.

Figure 4A:
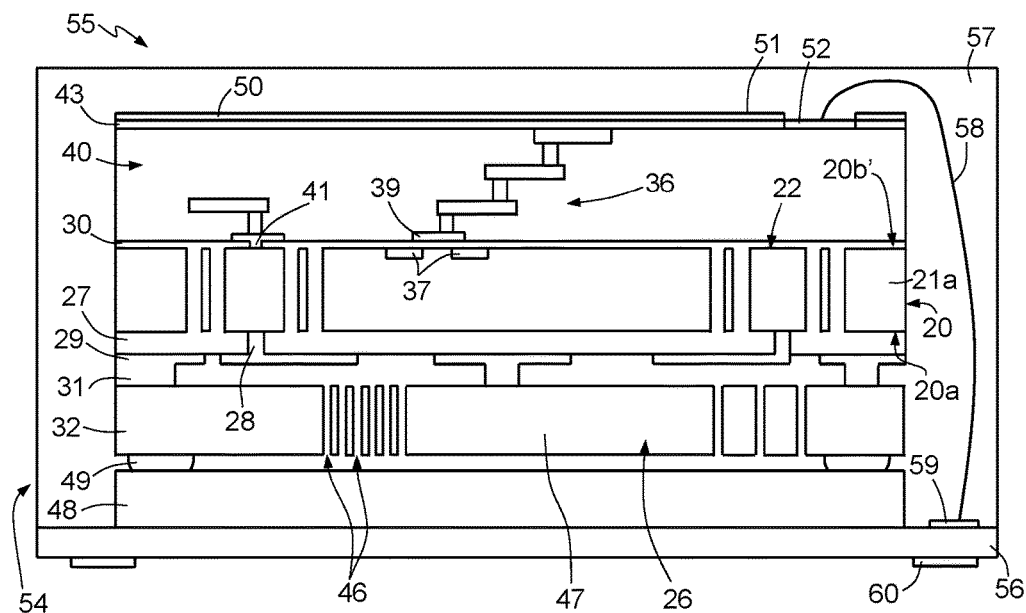
FIGS. 4a and 4b are schematic cross-sectional views of a package of the integrated semiconductor device.

FIG. 4A shows a possible embodiment of a package 54, of a standard land grid array (LGA) type, for the integrated semiconductor device, here designated as a whole by 55.

The package 54 includes a supporting layer 56, on which the covering 48 is bonded, for example using adhesive, and a molding 57, which coats the supporting layer 56 and the stack formed by the MEMS structure 26 and by the corresponding ASIC electronic circuit 36, made starting from the same substrate 20. A top surface of the aforesaid molding 57 in this case constitutes a top surface of the package 54, in contact with the external environment.

Electrical bonding wires 58 electrically connect the contact pads 52 to further contact pads 59 carried by the supporting layer 56, via the wire-bonding technique.

The aforesaid further contact pads 59 are further connected by electrical through vias (here not illustrated), which traverse the entire thickness of the supporting layer 56, to electrical-contact elements 60 carried by the bottom surface of the supporting layer 56 (which in this case constitutes the bottom base of the package 54, in contact with the external environment).

Figure 4B:
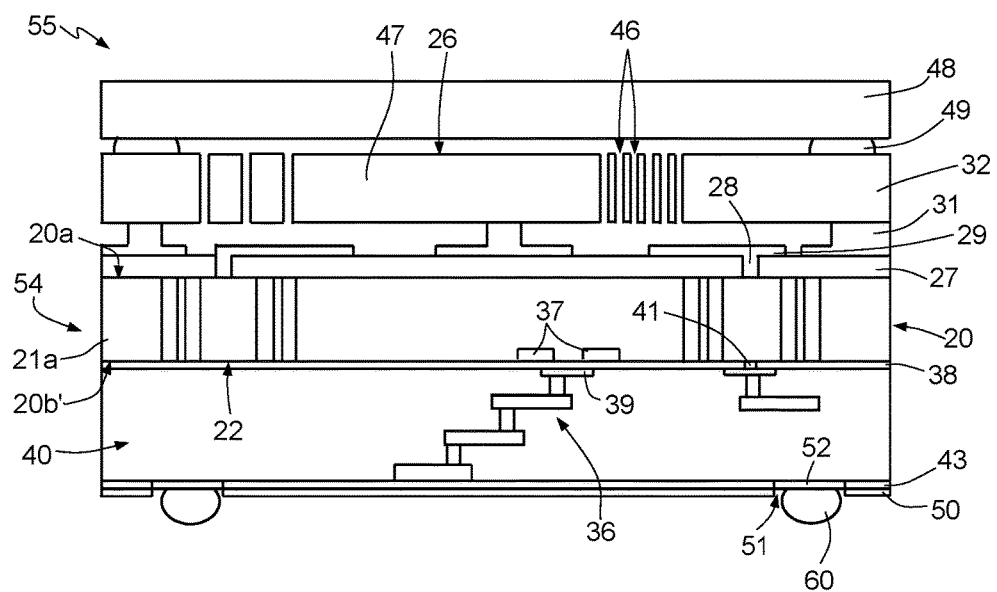

FIG. 4B shows a further embodiment of the package 54 of the integrated semiconductor device 55, of a ball grid array (BGA) type without molding.

In this case, the covering 48 itself defines a surface of the package 54, in contact with the external environment, and the passivation layer 50 that overlies the CMOS multilayer 40 of the ASIC electronic circuit 46 defines, itself, the outer opposite surface of the package 54 (which thus does not comprise any additional supporting or molding layer).

The electrical-contact elements 60, in this case in the form of conductive bumps, electrically contact the contact pads 52 on the outer surface of the package 54.

A second embodiment of the present solution is now described, which differs in that it envisages a different process for manufacturing the MEMS structure 26, which is also of a per se known type (the MEMS structure 26 defines in this case, for example, a pressure sensor). No substantial modifications are, instead, envisaged in the flow of integration of the MEMS structure 26 with the associated ASIC electronic circuit 36 in the same substrate 20.

Figure 5A:
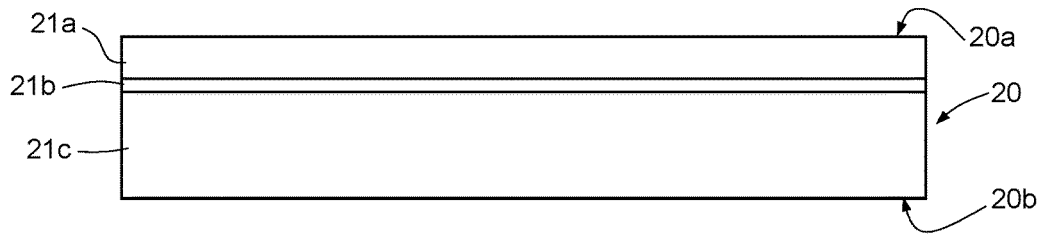
FIGS. 5a-5l are schematic cross-sectional views of an integrated semiconductor device in successive steps of a manufacturing process according to a second embodiment of the present solution.

As shown in FIG. 5A, the process starts once again with the provision of the substrate 20, of an SOI type.

In this case, elements constituting the pressure sensor defined by the MEMS structure 26 are provided in the active layer 21a of the substrate 20.

Figure 5B:
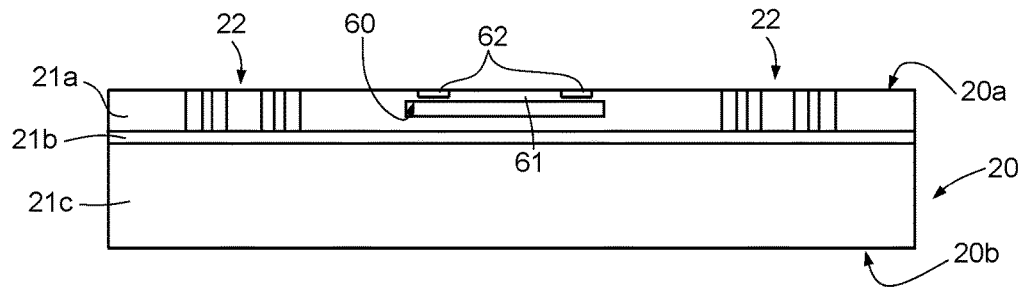

In particular, as shown in FIG. 5B, at least one buried cavity 60 is first provided within the active layer 21a, separated from the first top surface 20a of the substrate 20 by a membrane 61. Further provided are surface diffusions for formation of piezoresistor elements 62 in a surface portion of the membrane 61.

As described previously, interconnection structures 22 are formed through the active layer 21a, in this case laterally with respect to the arrangement of the buried cavity 60 and the membrane 61.

Figure 5C:
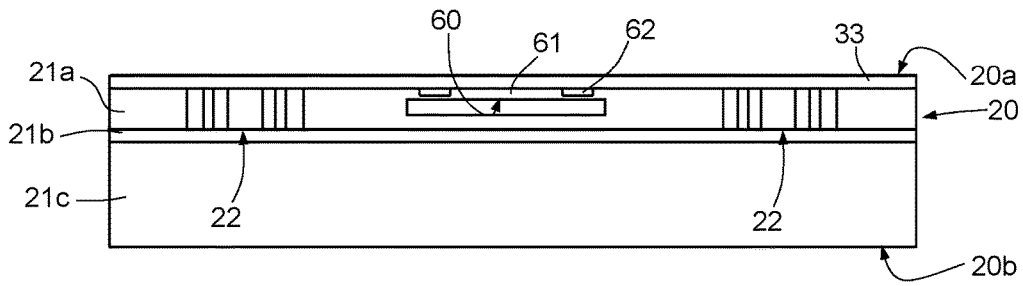
Figure 5D:
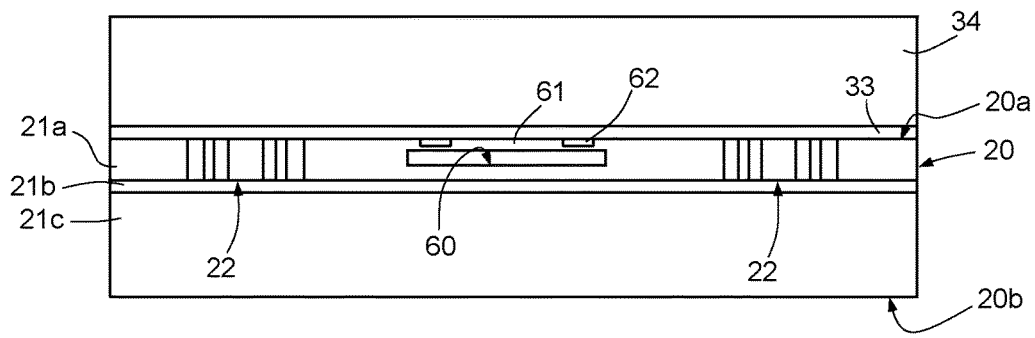
Figure 5E:
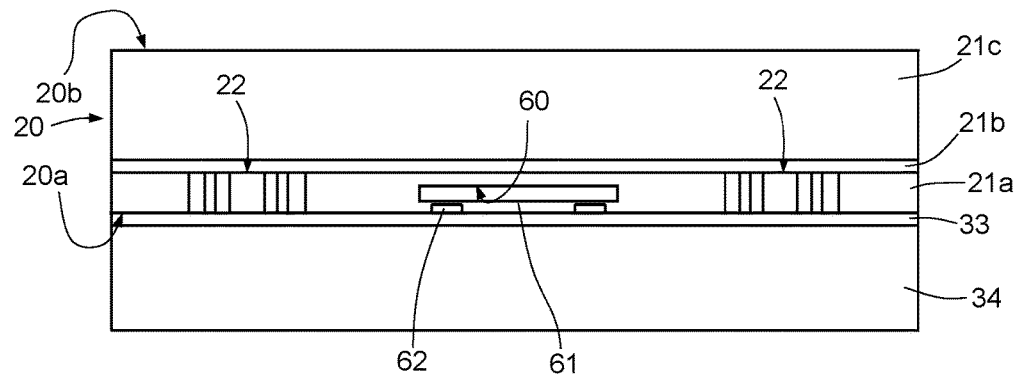
Figure 5F:
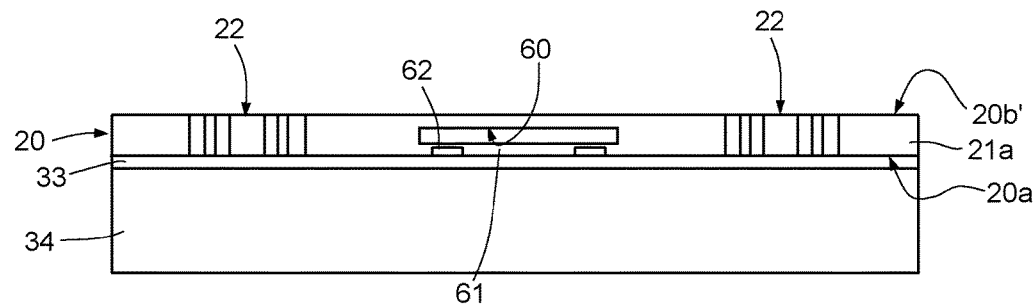
Figure 5G:
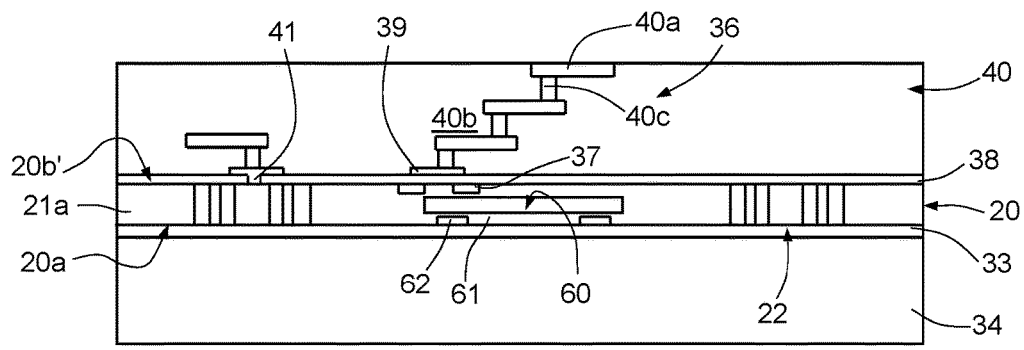
Figure 5H:
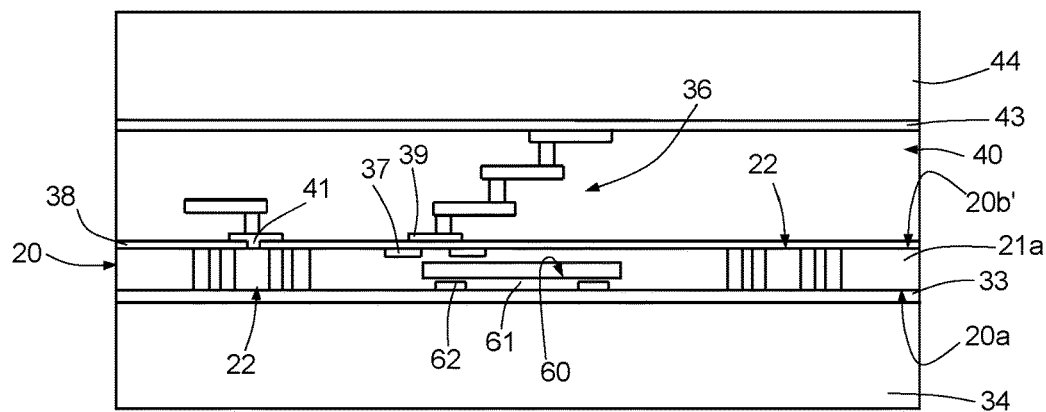
Figure 5I:
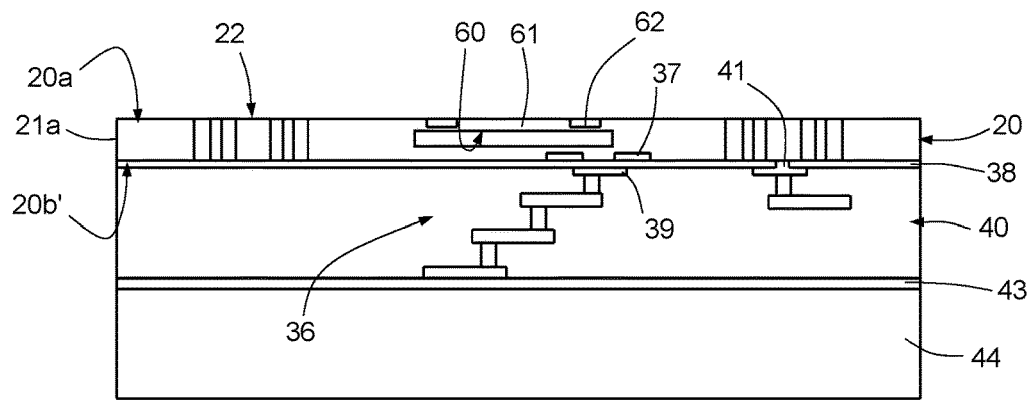

The manufacturing process then proceeds, as described previously, with: formation of the oxide layer 33 on the first surface 20a of the substrate 20 (FIG. 5C); subsequent bonding of the first service wafer 34 on the oxide layer 33 (FIG. 5D); wafer flipping (FIG. 5E); removal of the supporting layer 21c and of the insulating layer 21b of the substrate 20 (FIG. 5F); and subsequent CMOS process to obtain the ASIC electronic circuit 36 starting from the working surface 20b' of the active layer 21a of the same substrate 20, and also to obtain electrical contacts between the ASIC electronic circuit 36 and the MEMS structure 26 through the interconnection structures 22 (FIG. 5G); subsequent bonding of the second service wafer 44 on the oxide layer 43 previously formed on the CMOS multilayer 40 (FIG. 5H); and wafer flipping, and removal of the oxide layer 43 and second service wafer 44 for processing of the first surface 20a of the substrate 20 (FIG. 5I).

Figure 5J:
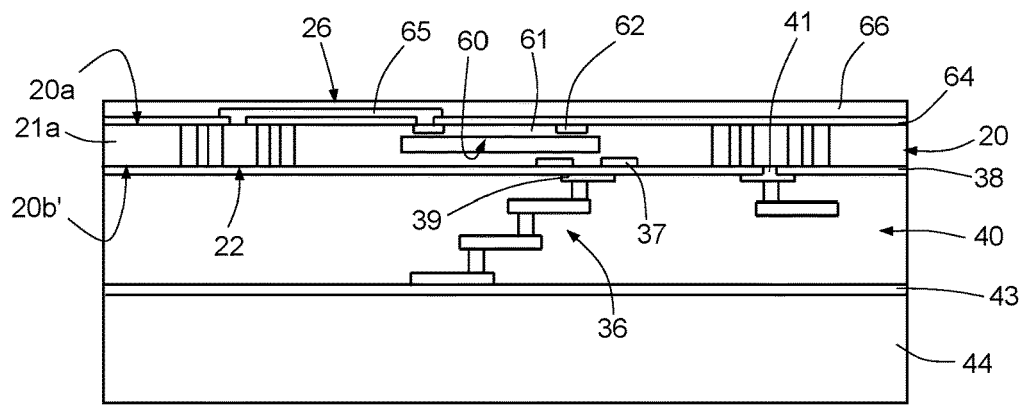

The manufacturing process then envisages the steps of completion of the MEMS structure 26 integrated in the substrate 20, which include in this case (FIG. 5J): formation of a surface insulation layer 64, for example of TEOS (Tetraethyl Orthosilicate); deposition and definition of a conductive layer 65 on the surface insulation layer 64 and within trenches that traverse the same surface insulation layer 64 to contact the piezoresistor elements 62 and also the connection portions 22a of the interconnection structures 22; and formation of a passivation layer 66 on the conductive layer 65.

Figure 5K:
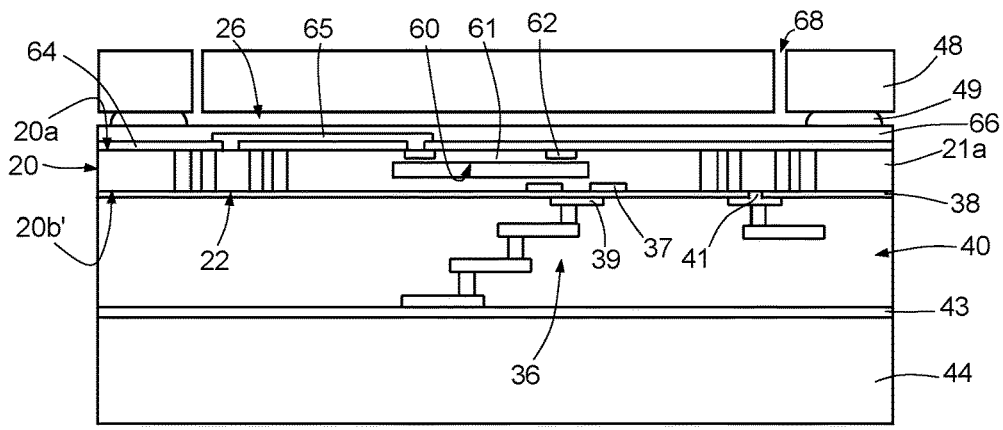

In a way similar to what has been described previously, the manufacturing process then proceeds (FIG. 5K) with coupling of the covering 48, in this case on the passivation layer 66, through which in this case access openings 68 are provided for enabling pressure waves coming from the external environment to reach the MEMS structure 26 integrated in the substrate 20.

Figure 5L:
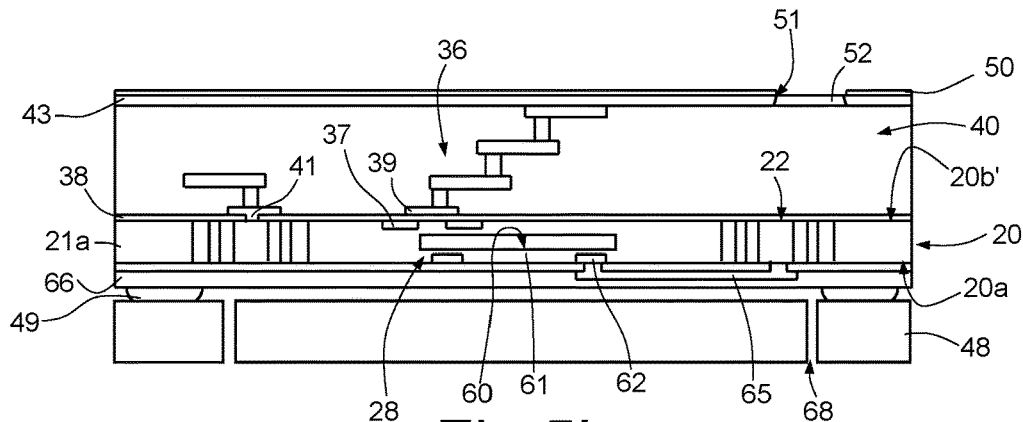

At this point (FIG. 5L), the structure being processed is flipped, the second service wafer 44 is removed, and the contact pads 52 for contacting the respective portions of the last metallization layer of the CMOS multilayer 40 are formed.

Figure 6A:
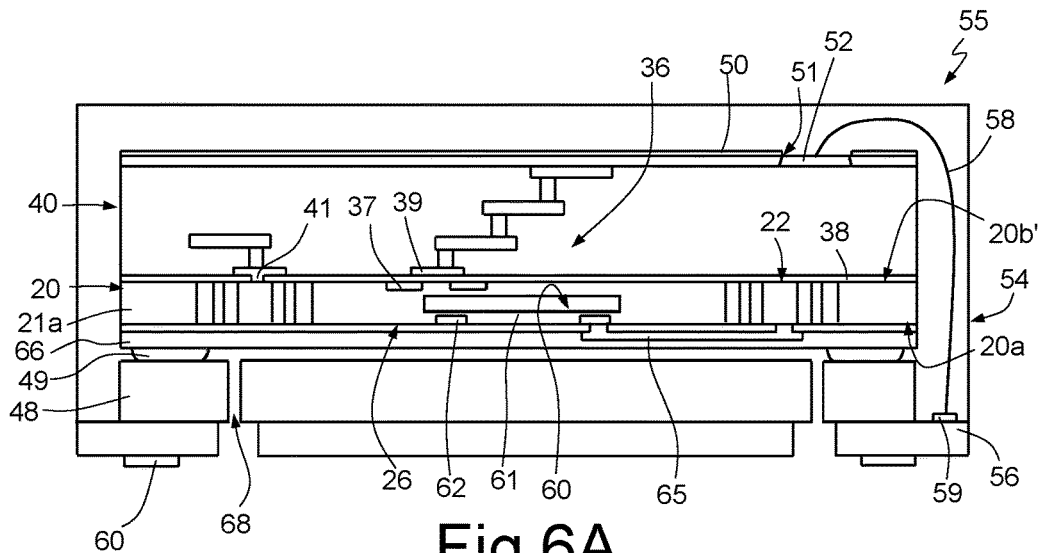

The package 54 of the integrated semiconductor device 55 also in this case (as described in detail previously) may be, for example, of a standard LGA type, as illustrated in FIG. 6A, or else of a BGA type without molding as illustrated in FIG. 6B.

Figure 7D:
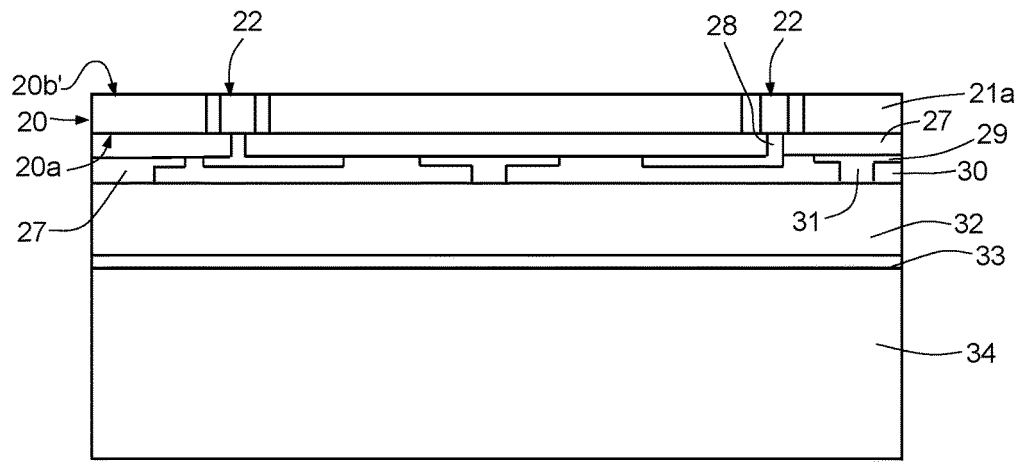

With reference first to FIG. 7A, a third embodiment of the present solution is now described, which differs from the one illustrated previously in that it starts from a standard substrate, for example with a doping of a P type, instead of an SOI composite substrate. As regards formation of the MEMS structure 26, this further embodiment does not differ, instead, from the first embodiment previously described.

As shown in FIG. 7B, in a surface portion of the substrate 20 at the first surface 20a, designated by 21a by analogy with what has been discussed previously, the interconnection structures 22 are provided, here formed by the connection portion 22a electrically insulated from the substrate 20 by the insulation portion 22b (here constituted by a simple vertical structure of silicon oxide or other insulating material that extends in depth throughout the thickness of the surface portion 21a).

On the first surface 20a of the substrate 20, the permanent insulation layer 27 is then formed, as discussed previously, with the conductive portions 28 that traverse the permanent insulation layer 27 to contact the connection portions 22a of the interconnection structures 22 (FIG. 7B).

The manufacturing process then proceeds, as described previously, with the steps of formation of the MEMS structure 26 (FIG. 7C), which envisages also in this case formation of: the conductive elements 29 on the permanent insulation layer 27; the sacrificial insulation layer 30, on the conductive elements 29 and on the permanent insulation layer 27; the anchorage elements 31 through the thickness of the sacrificial insulation layer 30; and the epitaxial layer 32 on the sacrificial insulation layer 30.

The oxide layer 33 is then formed on the first surface 20a of the substrate 20 and the first service wafer 34 is then bonded on the same oxide layer 33.

Next (FIG. 7D), the wafer is flipped and an etch of the substrate 20 is performed starting from the second surface 20b, until the surface portion 21a and the interconnection structures 22 are reached, thus defining the working surface 20b', starting from which the CMOS processing steps will then be carried out.

Figure 7E:
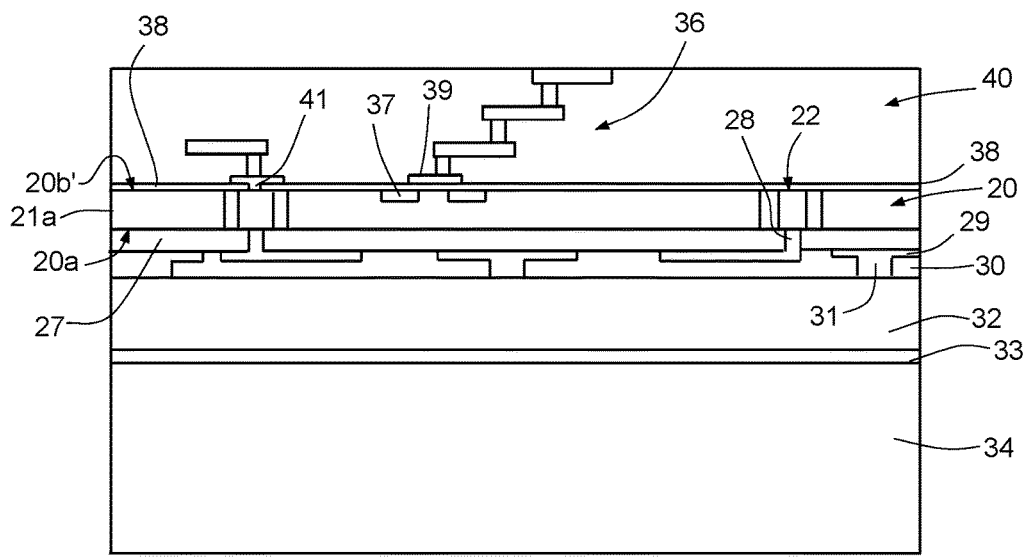
Figure 7F:
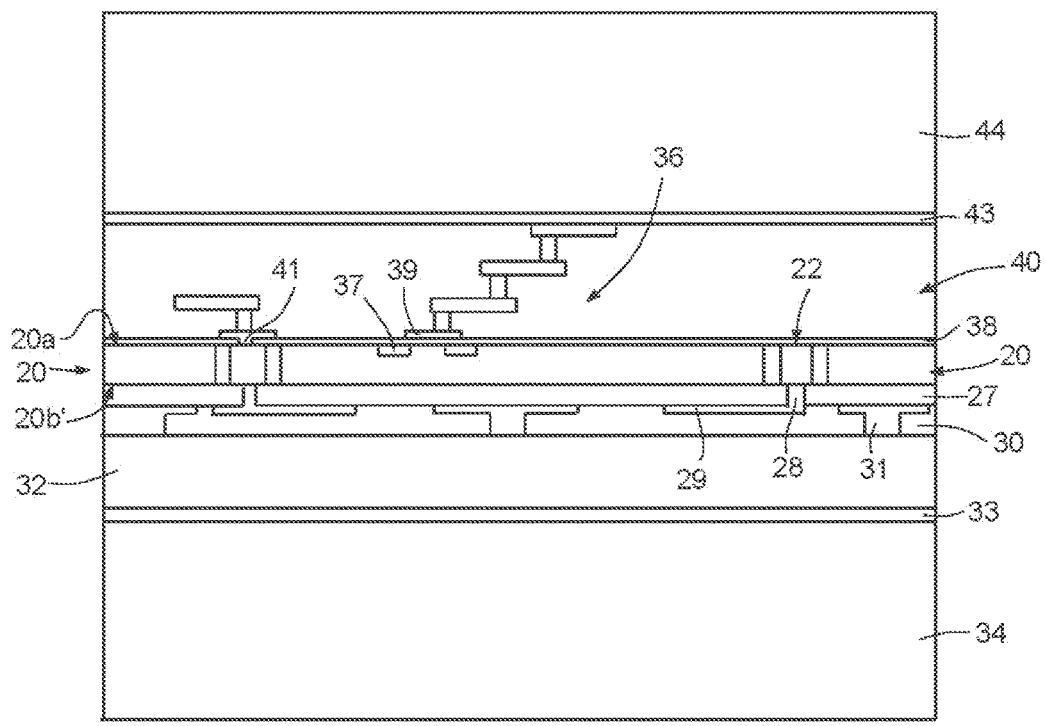
Figure 7G:
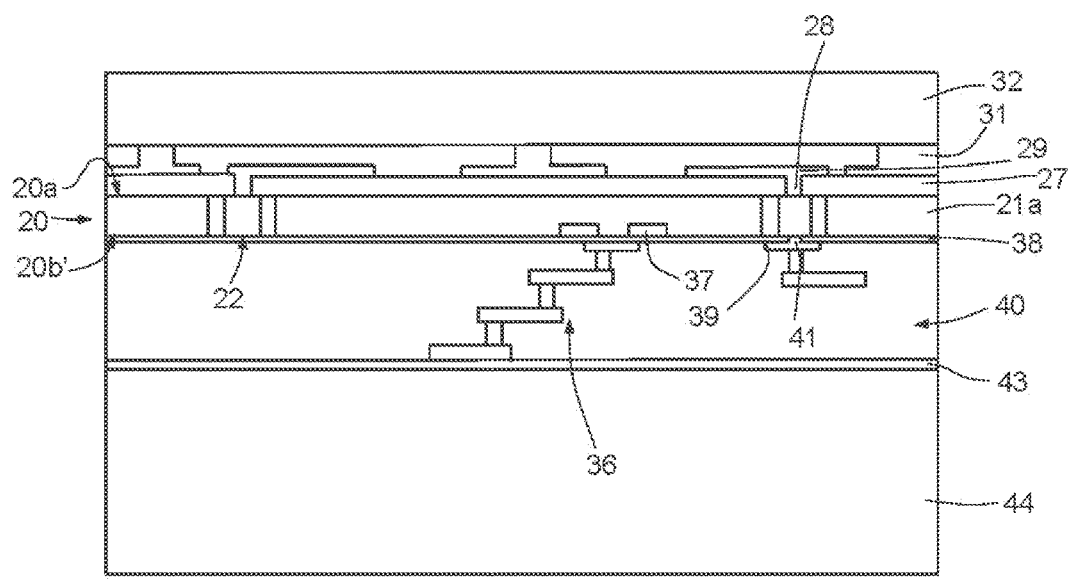

As illustrated previously, the manufacturing process then proceeds with: the CMOS process steps for providing the ASIC electronic circuit 36 starting from the aforesaid working surface 20b', and also electrical contacts between the ASIC electronic circuit 36 and the MEMS structure 26 through the interconnection structures 22 (FIG. 7E); subsequent bonding of the second service wafer 44 on the oxide layer 43 previously formed on the CMOS multilayer 40 (FIG. 7F); and flipping of the wafer, and removal of the oxide layer 43 and the second service wafer 44 (FIG. 7G).

Figure 7H:
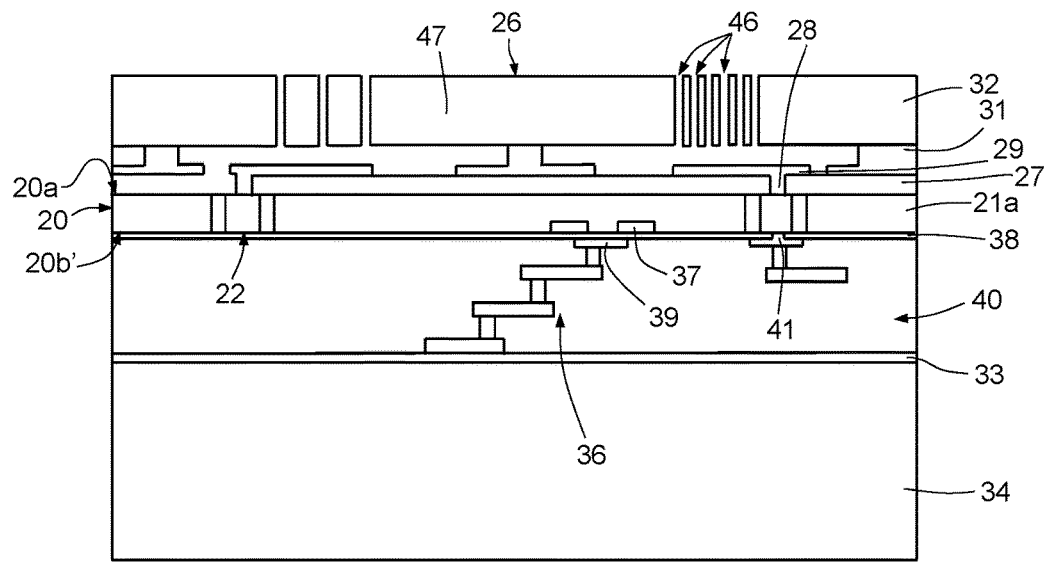
Figure 7I:
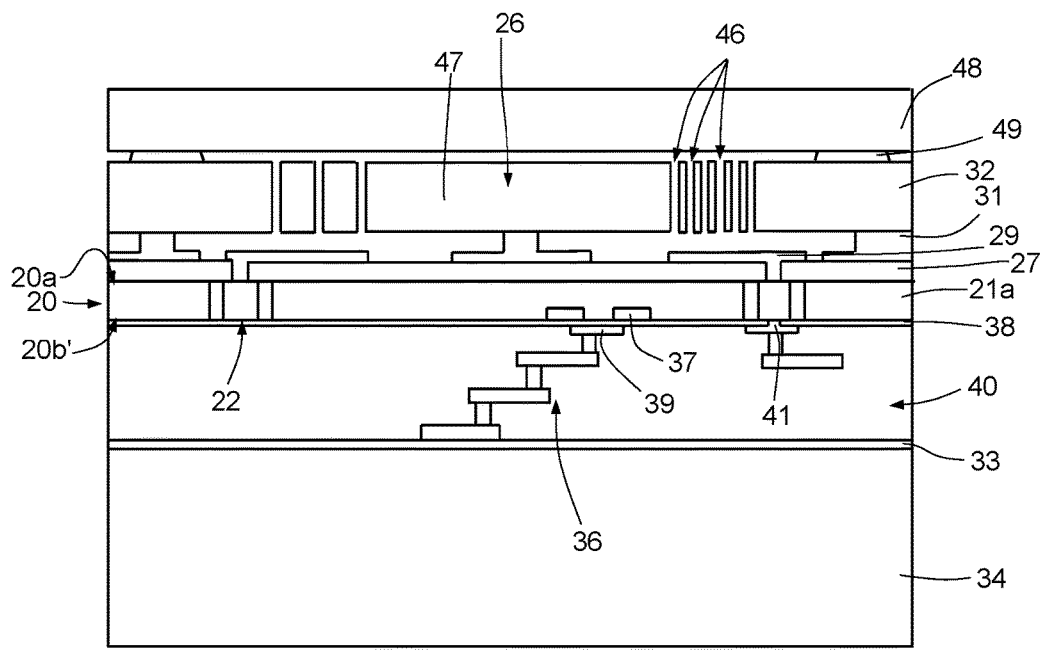

The last processing steps are thus performed leading to formation of the MEMS structure 26, as illustrated in FIG. 7H, and to subsequent coupling with the covering 48 (FIG. 7I).

Figure 7J:
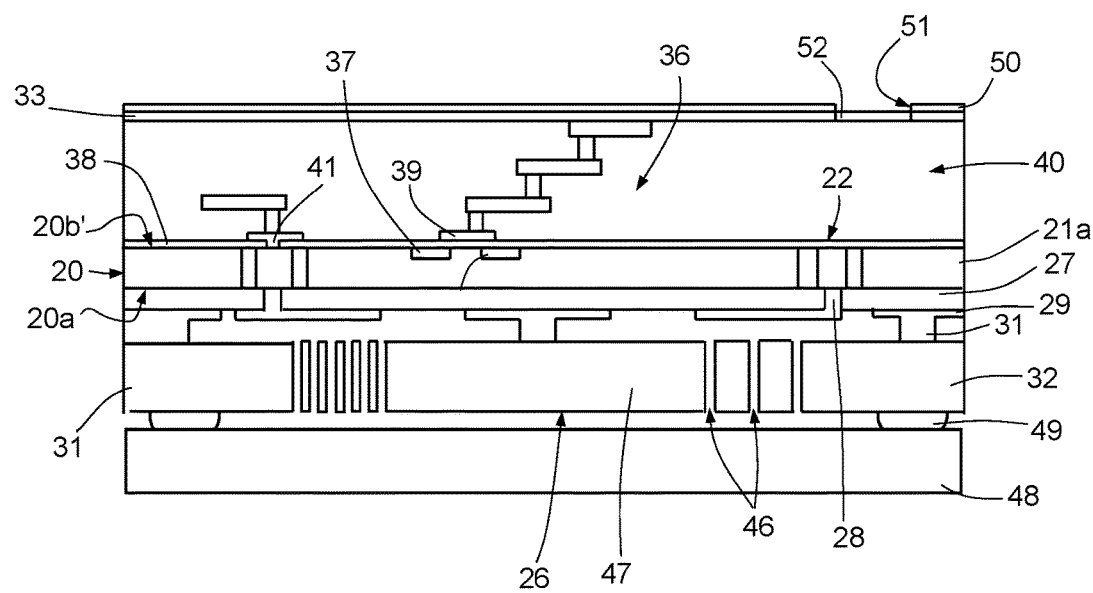

The structure being processed is then flipped again for removing the second service wafer 44 and defining the contact pads 52 for contacting the respective portions of the last metallization layer of the CMOS multilayer 40 (FIG. 7J).

In a way not illustrated herein, the process proceeds with formation of the package 54 of the integrated semiconductor device 55, in a way altogether similar to what has been discussed previously.

The advantages of the solution proposed emerge clearly from the previous description.

In particular, the solution described makes it possible to obtain a marked reduction in the horizontal dimensions (in the plane) and in the vertical dimension (out of the plane) of the resulting integrated semiconductor device 55.

The MEMS structure 26 and the CMOS electronic circuit 36 are provided in a same substrate 20 and may possibly be manufactured in a same production environment.

In general, the solution described affords an evident advantage in terms of manufacturing costs.

Moreover, further advantages are obtained in terms of performance, thanks to the reduction of the (capacitive and inductive) parasitic components in the electrical connection between the MEMS structure 26 and the ASIC electronic circuit 36, and to the consequent reduction of the noise generated, as well as in terms of reliability, thanks to the fact that the electrical connection between the MEMS structure 26 and the ASIC electronic circuit 36 is obtained with planar techniques at the front-end level, instead of being obtained with bonding techniques.

Finally, it is clear that modifications and variations may be made to what has been described and illustrated herein, without thereby departing from the scope of the present disclosure.

In particular, it is evident that the process described may find advantageous application also in the case where different technologies are used for manufacturing the MEMS structure 26 and/or the associated ASIC electronic circuit 36.

It is likewise evident that further types of package 54 may be envisaged for housing the MEMS structure 26 and the ASIC electronic circuit 36, integrated starting from the same substrate 20.

Furthermore, different embodiments may be envisaged for the interconnection structures 22, through the substrate 20, designed to enable connection between the MEMS structure 26 and the associated ASIC electronic circuit 36.

Figure 8:
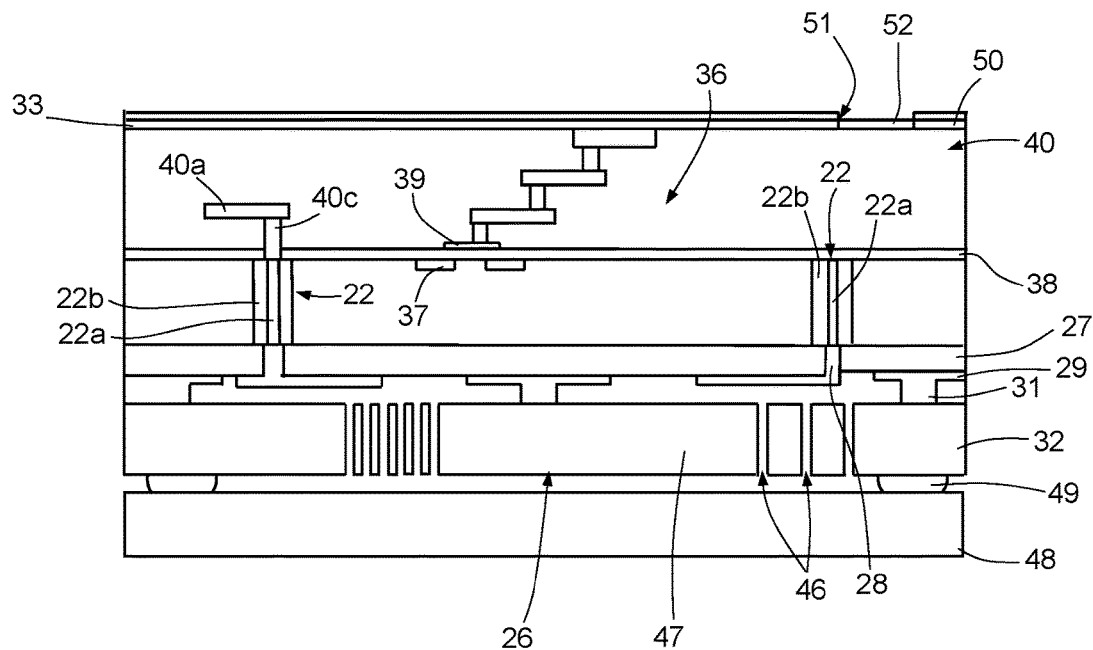
FIG. 8 is a schematic cross-sectional view of a further variant of the integrated semiconductor device.

For instance, as illustrated in FIG. 8, the connection portion 22a of the interconnection structures 22, electrically insulated from the substrate 20 by the insulation portion 22b (obtained once again by a simple vertical structure of silicon oxide or other insulating material that extends in depth through the thickness of the surface portion 21a) may include a vertical column of conductive material, in the example polysilicon.

In this case, the electrical contact with the first metallization layer 40a of the multilayer 40 of the CMOS structure of the ASIC electronic circuit 36 may be defined directly by the connection structure 22 and by an interconnection element 40c, which extends between a terminal end of the same interconnection structure 22, at the working surface 20b', and the first metallization layer 40a (as shown once again in FIG. 8); advantageously, this electrical contact is of an ohmic type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing an integrated semiconductor device, comprising:
  forming a micro-electro-mechanical system (MEMS) structure on a first surface of a substrate including semiconductor material, wherein forming said MEMS structure comprises carrying out first processing steps of forming said MEMS structure at said first surface;

forming an application specific integrated circuit (ASIC) electronic circuit on a second surface of said substrate, vertically opposite to said first surface, in a direction transverse to a horizontal plane of extension of said first surface;

electrically coupling said MEMS structure to said ASIC electronic circuit;

after carrying out said first processing steps, bonding a first service wafer over said MEMS structure, and vertically flipping said substrate, wherein forming the ASIC electronic circuit occurs after vertically flipping said substrate, wherein electrically coupling said MEMS structure to said ASIC electronic circuit comprises forming interconnection structures, which extend vertically through a first portion of said substrate starting from said first surface; and removing a second portion of said substrate, vertically opposite to said first portion, so as to define said second surface and to make said interconnection structures accessible at said second surface, said interconnection structures thereby having a first end at said first surface and a second end at said second surface; wherein forming said ASIC electronic circuit is performed at said second surface after removing said second portion of said substrate.

2. The process according to claim 1, wherein electrically coupling said MEMS structure to said ASIC electronic circuit further comprises forming at least one conductive path between the second end of at least one of said interconnection structures and at least one conductive element of said ASIC electronic circuit.

3. The process according to claim 1, wherein removing said second portion of said substrate is carried out after said flipping step.

4. The process according to claim 3, further comprising, after forming said ASIC electronic circuit, bonding a second service wafer over said ASIC electronic circuit and once again flipping said substrate; and wherein forming said MEMS structure further comprises, after said step of once again flipping said substrate: removing said first service wafer from said first surface; and carrying out second processing steps of said MEMS structure.

5. The process according to claim 4, wherein said first, or second, processing steps of said MEMS structure comprise forming at least one conductive path between the first end of at least one of said interconnection structures and at least one element of said MEMS structure.

6. The process according to claim 4, wherein said first processing steps comprise forming a sacrificial layer over said first surface and forming an epitaxial layer on said sacrificial layer; and wherein said second processing steps comprise forming through openings through said epitaxial layer, and carrying out a chemical etch that removes said sacrificial layer and defines at least one suspended element above said substrate.

7. The process according to claim 4, wherein said first processing steps comprise forming at least one buried cavity within the surface portion of said substrate, a membrane suspended above the buried cavity, and piezoresistive elements in said membrane; and wherein said second processing steps comprise forming said conductive path between the first end of at least one of said interconnection structures and at least one of said piezoresistive elements of said MEMS structure.

8. The process according to claim 1, wherein forming said ASIC electronic circuit comprises forming a complementary metal oxide semiconductor (CMOS) multilayer over said second surface.

9. The process according to claim 1, wherein:
said substrate is of a silicon on insulator (SOI) type, and
said surface portion is an active layer of the SOI substrate.

10. The process according to claim 1, further comprising coupling a covering over said MEMS structure.

11. A process for manufacturing an integrated semiconductor device, comprising:
forming a micro-electro-mechanical system (MEMS) structure on or in a first surface of a semiconductor layer;
forming an application specific integrated circuit (ASIC) electronic circuit on or in a second surface of the semiconductor layer, vertically opposite to said first surface, in a direction transverse to a horizontal plane of extension of said first surface; and
forming interconnection structures that extend vertically through the semiconductor layer and electrically couple the MEMS structure to the ASIC electronic circuit;
bonding a service wafer to the semiconductor layer;
flipping the semiconductor layer while bonded to the service wafer, wherein a first one of the steps of forming the MEMS structure and forming the ASIC electronic circuit is performed before flipping the semiconductor layer and a second one of the steps of forming the MEMS structure and forming the ASIC electronic circuit is performed after flipping the semiconductor layer; and
removing a portion of said semiconductor layer, vertically opposite to said first surface, so as to define said second surface and to make said interconnection structures accessible at said second surface, said interconnection structures thereby having a first end at said first surface and a second end at said second surface; wherein forming said ASIC electronic circuit is performed at said second surface after removing said portion of said semiconductor layer.

12. The process according to claim 11, wherein flipping the semiconductor layer is performed after forming the MEMS structure and before forming the ASIC electronic circuit.

13. A process for manufacturing an integrated semiconductor device, comprising:
forming electrically conductive interconnection structures extending through a silicon semiconductor layer of a silicon-on-insulator (SOI) substrate that also includes a supporting layer and an insulating layer;
forming a micro-electro-mechanical system (MEMS) structure on a first surface of the silicon semiconductor layer, wherein forming the MEMS structure comprises carrying out first processing steps of manufacturing the MEMS structure on the first surface;
bonding a first service wafer over said MEMS structure, and vertically flipping the SOI substrate;
removing the supporting layer and insulating layer after vertically flipping the SOI substrate, thereby exposing a second surface of the silicon semiconductor layer, vertically opposite to the first surface; and
forming an application specific integrated circuit (ASIC) electronic circuit on the second surface of the silicon semiconductor layer, the ASIC electronic circuit being electrically coupled to the MEMS structure by the interconnection structures.

14. The process according to claim 13, wherein bonding the first service wafer over said MEMS structure, and vertically flipping the SOI substrate are performed after carrying out the first processing steps.

15. The process according to claim 13, further comprising, after forming the ASIC electronic circuit, bonding a second service wafer over the ASIC electronic circuit and once again flipping the SOI substrate, wherein forming the MEMS structure further comprises, after once again flipping the SOI substrate: removing the first service wafer from the first surface; and carrying out second processing steps of the MEMS structure.

16. The process according to claim 15, wherein the first processing steps comprise forming a sacrificial layer over the first surface and forming an epitaxial layer on the sacrificial layer; and wherein said second processing steps comprise forming through openings through the epitaxial layer, and carrying out a chemical etch that removes said sacrificial layer and defines at least one suspended element above the silicon semiconductor layer.

17. The process according to claim 15, wherein bonding the second service wafer over the ASIC electronic circuit is performed before once again flipping the SOI substrate.

18. The process according to claim 13, wherein forming the ASIC electronic circuit on the second surface of the silicon semiconductor layer includes forming a complementary metal oxide semiconductor (CMOS) multilayer on the second surface of the silicon semiconductor layer and forming the ASIC electronic circuit in the CMOS multilayer.

* * * * *